(12) United States Patent
Ihle et al.

(10) Patent No.: US 12,014,852 B2
(45) Date of Patent: Jun. 18, 2024

(54) SENSOR ELEMENT AND METHOD FOR PRODUCING A SENSOR ELEMENT

(71) Applicant: TDK Electronics AG, Munich (DE)

(72) Inventors: Jan Ihle, Raaba-Grambach (AT); Thomas Bernert, Deutschlandsberg (AT); Gerald Kloiber, Feldkirchen (AT)

(73) Assignee: TDK Electronics AG, Munich (DE)

( * ) Notice: Subject to any disclaimer, the term of this patent is extended or adjusted under 35 U.S.C. 154(b) by 0 days.

(21) Appl. No.: 17/636,286

(22) PCT Filed: Sep. 15, 2020

(86) PCT No.: PCT/EP2020/075734
§ 371 (c)(1),
(2) Date: Feb. 17, 2022

(87) PCT Pub. No.: WO2021/073820
PCT Pub. Date: Apr. 22, 2021

(65) Prior Publication Data
US 2022/0293305 A1    Sep. 15, 2022

(30) Foreign Application Priority Data
Oct. 16, 2019  (DE) .......................... 102019127915.1

(51) Int. Cl.
*H01C 7/04*  (2006.01)
*G01K 7/22*  (2006.01)
(Continued)

(52) U.S. Cl.
CPC .............. *H01C 7/041* (2013.01); *G01K 7/22* (2013.01); *H01C 1/1413* (2013.01); *H01C 7/048* (2013.01); *H01C 17/075* (2013.01)

(58) Field of Classification Search
CPC ...... H01C 7/041; H01C 7/048; H01C 17/075; H01C 17/20; H01C 1/1413; G01K 7/22
See application file for complete search history.

(56) References Cited

U.S. PATENT DOCUMENTS

| 5,628,919 A | 5/1997 | Tomura et al. |
| 7,547,407 B2 | 6/2009 | Matsuda et al. |

(Continued)

FOREIGN PATENT DOCUMENTS

| CN | 1630946 A | 6/2005 |
| CN | 110993332 A | 4/2020 |

(Continued)

OTHER PUBLICATIONS

Ruffing, K., "Semiconductor chips embedded directly in the substrate," All-Electronics, https://www.all-electronics.de/markt/halbleiterchips-direkt-im-substrat-eingebettet.html (Stand: Feb. 19, 2013, 16:39), Feb. 19, 2013, 17 pages.

*Primary Examiner* — Kyung S Lee
(74) *Attorney, Agent, or Firm* — Slater Matsil, LLP (57) ABSTRACT

In an embodiment a sensor element includes at least one carrier layer having a top side and an underside and at least one functional layer, wherein the functional layer is arranged at the top side of the carrier layer and includes a material having a temperature-dependent electrical resistance, wherein the sensor element is configured to be integrated as a discrete component directly into an electrical system, and wherein the sensor element is configured to measure a temperature.

18 Claims, 4 Drawing Sheets

(51) Int. Cl.
*H01C 1/14* (2006.01)
*H01C 17/075* (2006.01)

(56) References Cited

U.S. PATENT DOCUMENTS

| | | | |
|---|---|---|---|
| 7,586,755 B2 | 9/2009 | Satoh et al. | |
| 7,746,213 B2 | 6/2010 | Zitzmann et al. | |
| 8,434,941 B2 | 5/2013 | Bernitz | |
| 8,436,426 B2* | 5/2013 | Le Neel | H01L 28/20 |
| | | | 257/379 |
| 8,610,281 B1 | 12/2013 | Nguyen et al. | |
| 9,029,180 B2 | 5/2015 | Britton et al. | |
| 9,496,202 B2 | 11/2016 | Hashimoto | |
| 9,945,734 B1 | 4/2018 | Arft et al. | |
| 10,788,377 B2 | 9/2020 | Ihle et al. | |
| 10,790,263 B2 | 9/2020 | Lee | |
| 10,908,030 B2* | 2/2021 | Ihle | G01K 7/22 |
| 2010/0096666 A1 | 4/2010 | Ishida et al. | |
| 2014/0376595 A1 | 12/2014 | Daley et al. | |
| 2015/0042445 A1* | 2/2015 | Fujita | H01C 7/041 |
| | | | 204/192.15 |
| 2015/0055682 A1* | 2/2015 | Nagatomo | G01K 1/143 |
| | | | 374/185 |
| 2015/0276504 A1 | 10/2015 | Yanata et al. | |
| 2016/0259139 A1 | 9/2016 | Kraft et al. | |
| 2018/0321088 A1* | 11/2018 | Martinez | G01K 1/08 |

FOREIGN PATENT DOCUMENTS

| | | |
|---|---|---|
| DE | 10358282 A1 | 7/2005 |
| DE | 102006033856 B3 | 2/2008 |
| DE | 102009026439 A1 | 12/2010 |
| DE | 102016101247 A1 | 5/2017 |
| JP | H06124810 A | 5/1994 |
| JP | H09148178 A | 6/1997 |
| JP | 2000013016 A | 1/2000 |
| JP | 2007019149 A | 1/2007 |
| JP | 2009076608 A | 4/2009 |
| JP | 2012156274 A | 8/2012 |
| JP | 2013197367 A | 9/2013 |
| JP | 2013538462 A | 10/2013 |
| JP | 2015034760 A | 2/2015 |
| JP | 2017535054 A | 11/2017 |
| JP | 2018169248 A | 11/2018 |
| JP | 2019158815 A | 9/2019 |
| WO | 2006109369 A1 | 10/2006 |
| WO | 2015015953 A1 | 2/2015 |

* cited by examiner

SENSOR ELEMENT AND METHOD FOR PRODUCING A SENSOR ELEMENT

This patent application is a national phase filing under section 371 of PCT/EP2020/075734, filed Sep. 15, 2020, which claims the priority of German patent application 102019127915.1, filed Oct. 16, 2019, each of which is incorporated herein by reference in its entirety.

TECHNICAL FIELD

The present invention relates to a sensor element, in particular a temperature sensor. The present invention furthermore relates to a method for producing a sensor element, preferably a temperature sensor.

BACKGROUND

In order to integrate temperature sensors, especially NTC (NTC=Negative Temperature Coefficient) based thermistors, into present-day electrical systems, the dimensions of the sensor elements have to fit into modern packaging designs, which are in the micrometer-scale and even nanometer-scale range. In order to achieve this degree of miniaturization, sensors are deposited as thin films on carrier structures with electrical connections and are described as a discrete component.

NTC thermistors have been available hitherto as "bare die" (unpackaged semiconductor chip) or in an SMD (Surface Mounted Device) design on printed circuit boards. However, these technical solutions are not suitable for the integration of temperature sensor elements in MEMS (MicroElectroMechanical System) or SESUB (Semiconductor Embedded in Substrate) structures, for example. Very small elements are necessary for these systems, which elements must moreover also be able to be integrated by way of suitable contacting methods. Traditional soldering methods for SMD designs or wire bonding technologies for "bare dies" cannot be used for this purpose. Therefore, temperature sensors have not been available hitherto as discrete components for direct integration for MEMS or SESUB structures.

SUMMARY

Embodiments provide a sensor element and a method for producing a sensor element.

In accordance with one embodiment, a sensor element is described. The sensor element is configured for measuring a temperature. The sensor element is a temperature sensor. The sensor element comprises at least one carrier layer. The carrier layer has a top side and an underside. The carrier layer comprises a carrier material. Preferably, the carrier layer comprises silicon, silicon carbide or glass (silicate or borosilicate glass).

The sensor element furthermore comprises at least one functional layer or sensor layer. The sensor element can also comprise more than one functional layer, for example two or three functional layers. The functional layer comprises a material (sensor material) having a temperature-dependent electrical resistance. Preferably, the functional layer has an NTC characteristic.

The functional layer is preferably arranged at the top side of the carrier layer. The functional layer preferably completely covers the top side of the carrier layer. The functional layer is formed directly on the top side of the carrier layer. In particular, the sensor material is situated in a positively locking and cohesive manner on the material of the carrier layer. As an alternative thereto, the sensor material is produced directly in the material of the carrier layer locally or as a layer.

By virtue of the specific composition, the sensor element can be embodied very compactly. By way of example, the sensor element has a width of preferably less than or equal to 500 µm, for example 100 µm or 250 µm. The sensor element 1 furthermore has a length of preferably less than or equal to 500 µm, for example 100 µm or 250 µm. The sensor element preferably has a height or thickness of less than or equal to 100 µm, for example 50 µm.

Consequently, the sensor element is embodied very compactly, and so it can be integrated as a complete component into an electrical system, such as a printed circuit board or a silicon chip. In particular, the sensor element is configured to be embedded as a discrete component directly into an electrical system. By way of example, the sensor element is configured for direct integration into a MEMS structure and/or into an SESUB structure.

In one embodiment, the functional layer comprises a thin-film layer, in particular a thin-film NTC layer. In other words, the functional layer has only a very small thickness. By way of example, the functional layer has a thickness d of $10\ nm \leq d \leq 1\ \mu m$, for example 500 nm. A very small, discrete component that can be embedded into existing structures without any problems is made available in this way.

In one embodiment, the functional layer comprises a semiconducting material based on silicon carbide in the hexagonal, wurtzite-like structure or the cubic phase in the zinc blende structure type. As an alternative thereto, the functional layer can comprise a metal nitride in the wurtzite structure type. These materials make it possible to deposit the functional layer on the carrier layer as a stable thin-film sensor layer. A reliable and compact sensor element can thus be made available.

In one embodiment, the sensor element comprises a protective layer. The protective layer is arranged at a top side of the sensor element. The protective layer preferably completely covers the top side of the sensor element.

By way of example, the protective layer is formed on a top side of the functional layer. However, the protective layer can also be formed on structures that are arranged on the functional layer. The protective layer protects the sensor element against external influences. The protective layer preferably comprises $SiO_2$.

In a further embodiment, at least one side surface, preferably all side surfaces, of the sensor element can also be covered by a protective layer. This protective layer likewise preferably comprises $SiO_2$. In particular, this protective layer preferably consists of $SiO_2$.

In one embodiment, the sensor element comprises at least one feedthrough. The sensor element can also comprise more than one feedthrough, for example tow or four feedthroughs. The feedthrough comprises a metallic material. The feedthrough completely penetrates through the carrier layer. In other words, the feedthrough extends from the functional layer at the top side of the carrier layer through to the underside of the carrier layer. In this case, the underside of the carrier layer is that side of the carrier layer or of the sensor element which bears on the electronic system into which the sensor element is integrated, or on a component of the electronic system.

In an alternative embodiment, the feedthrough can additionally completely penetrate through the functional layer as well. In this case, the feedthrough extends from a top side of the functional layer through the functional layer and the carrier layer as far as the underside of the carrier layer.

Furthermore, at least one contact element for electrically contacting the sensor element is formed at the underside of the carrier layer. However, the sensor element can also comprise more than one contact element, for example two or four contact elements. The contact element is directly connected to the feedthrough at the underside of the carrier layer.

The contact element can comprise a bump or a thin electrode, for example. Feedthrough and contact element constitute the electrical contact and connection areas that enable the sensor element to be electrically contacted. Traditional soldering methods for SMD designs or wire bonding for electrical contacting can accordingly be obviated. The sensor element is thus outstandingly suitable for being integrated into a MEMS or SESUB structure.

In one embodiment, the sensor element furthermore comprises at least one top electrode. The top electrode comprises Au, Ni, Cr, Ag, W, Ti or Pt, for example. The top electrode is configured for electrically contacting the functional layer from a top side of the functional layer. The sensor element can thus be contacted in a reliable manner from the underside by way of the feedthrough and the contact element and from the top side by way of the top electrode.

Preferably, the top electrode is arranged directly on the functional layer. In particular, the top electrode is deposited on the top side of the functional layer. The top electrode can be sputtered onto the functional layer. The top electrode comprises a thin metal film. Preferably, the top electrode is a thin-film electrode. The top electrode can be formed as a single layer or in a multilayered fashion. By way of example, the top electrode has a thickness d of $10\ nm \leq d \leq 1\ \mu m$, for example 500 nm. A very compact component for direct integration into an electrical system is made available in this way.

In one embodiment, the sensor element comprises at least two top electrodes. Preferably, the top electrodes are arranged next to one another. In this case, the respective top electrode covers only a part of the top side of the functional layer.

The top electrodes are spatially separated and electrically isolated from one another by at least one cutout or at least one gap. The resistance of the sensor element can be varied or set by means of the size (in particular the width) of the cutout and thus the magnitude of the distance between the top electrodes.

Instead of a cutout, it is also possible to provide a structure intermeshing in a comblike manner between the two top electrodes. The area between the top electrodes is enlarged in this way. Furthermore, the resistance of the sensor element and also a variation of the resistance are reduced by the comblike structure.

In accordance with one embodiment, a method for producing a sensor element is described. Preferably, the sensor element described above is produced by the method. All properties disclosed with regard to the sensor element or the method are also correspondingly disclosed with regard to the respective other embodiment, and vice versa, even if the respective property is not explicitly mentioned in the context of the respective embodiment. The method comprises the following steps:
A) Providing a carrier material for forming the carrier layer (wafer). The carrier material preferably comprises Si, SiC or glass. The carrier layer formed by the carrier material serves for stabilizing the sensor element.
B) Forming at least one feedthrough. In this exemplary embodiment, the feedthrough completely penetrates through the carrier material. In other words, a perforation through the carrier material is produced, which perforation is filled with a metallic material later.
C) Filling the at least one feedthrough with a metallic material, for example electrolytically. The metallic material can comprise copper or gold, for example.
D) Coating the carrier material with a sensor material for forming the functional layer. The sensor material can comprise a thin-film layer having an NTC characteristic. The coating is preferably affected by means of a PVD ("physical vapor deposition") process, a CVD ("chemical vapor deposition") process or electrolytically. The resultant functional layer is preferably a thin-film NTC layer.

Optionally, a heat treatment step can subsequently be affected.
E) Singulating the sensor elements. This can be affected for example by application of photoresist and subsequent plasma etching or sawing and notching of functional layer and carrier layer.

The method produces a reliable and compact discrete sensor element which can easily be integrated into existing electrical systems.

In one embodiment, depositing at least one top electrode onto a top side of the sensor material is affected before step E). This step is optional, that is to say that the resulting sensor element can also be formed without a top electrode and be contacted only by way of the feedthroughs and contact elements from the underside.

Depositing the top electrode is preferably affected by means of a PVD process, a CVD process or electrolytically. The resultant top electrode is preferably a thin-film electrode.

In one embodiment, step D) is carried out before step B). In other words, coating the carrier material with the sensor material can be affected before forming the at least one feedthrough. In this exemplary embodiment, the feedthrough projects into the functional layer and is enclosed by the latter. Preferably, the feedthrough completely penetrates through the carrier layer and the functional layer.

BRIEF DESCRIPTION OF THE DRAWINGS

The drawings described below should not be regarded as true to scale. Rather, individual dimensions may be illustrated in an enlarged, reduced or even distorted way for the sake of better illustration.

Elements which are identical to one another or which perform the same function are designated by identical reference signs.

In the figures.

DETAILED DESCRIPTION OF ILLUSTRATIVE EMBODIMENTS

Figure 1:
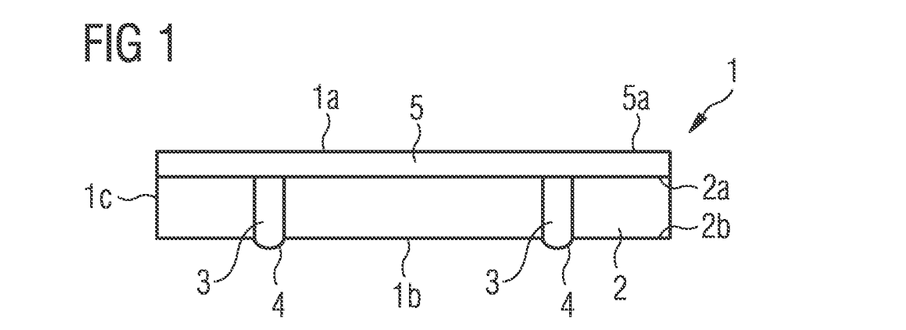
FIG. 1 shows a sensor element in a first embodiment.

FIG. 1 shows a sensor element 1 in accordance with a first embodiment. The sensor element 1 is preferably configured for measuring a temperature. The sensor element 1 comprises at least one carrier layer 2 or wafer 2. The carrier layer 2 has a top side 2a and an underside 2b. The carrier layer 2 comprises a carrier material, preferably silicon (Si), silicon carbide (SiC) or glass. The carrier layer 2 serves for mechanically stabilizing the sensor element 1.

The sensor element 1 furthermore comprises at least one functional layer 5 or sensor layer 5. In this exemplary embodiment, the sensor element 1 comprises exactly one functional layer 5. However, a plurality of functional layers 5 is also conceivable, for example two, three or four functional layers 5, which can be arranged next to one another or one above another, for example.

In this exemplary embodiment, the functional layer 5 is arranged at the top side 2a of the carrier layer 2. The functional layer 5 preferably completely covers the top side 2a of the carrier layer 2. The functional layer 5 is arranged in a positively locking and cohesive manner on the carrier layer 2. As an alternative thereto, the functional layer 5 is produced directly in the carrier material locally or as a layer.

The functional layer 5 comprises a material having a temperature-dependent electrical resistance, preferably a material having an NTC R/T characteristic. Preferably, the functional layer 5 is formed as a thin-film NTC layer on the carrier layer 2. The functional layer 5 has a very small thickness of less than or equal to 1 μm.

By way of example, the functional layer 5 comprises a semiconducting material based on SiC in the hexagonal, wurtzite-like structure or the cubic phase in the zinc blende structure type. In this case, the silicon carbide can be present in a pure form, in doped fashion (for example with Ti, Cr, N, Be, B, Al, Ga) or as a mixed crystal (for example $(SiC)_x(AlN)_{1-x}$), or can contain intermetallic phases such as, for example, $Al_4SiC_4$, $Ti_3SiC_2$ or $Y_3Si_2C_2$.

As an alternative thereto, the functional layer 5 can also be based on metal nitrides in the Wurtzit structure type, such as AlN or GaN. AlN can be present in a pure form, as a mixed crystal (for example $(Al_xTi_{1-x})(N_yO_{1-y})$ or $Al_xGa_{1-x}N$, where 0≤x, y≤1) or in doped fashion (for example with Si, Mg, C, Ge, Se or Zn).

In this exemplary embodiment, the carrier layer 2 furthermore has two feedthroughs 3. As an alternative thereto, the sensor element 1 can also have only one feedthrough 3 (in this respect, see FIG. 3) or no feedthrough 3 at all (in this respect, see FIG. 4). Furthermore, more than two feedthroughs 3, for example three or four feedthroughs, are also conceivable (not explicitly illustrated).

The respective feedthrough 3 completely penetrates through the carrier layer 2. In other words, the feedthrough 3 projects from the top side 2a as far as the underside 2b of the carrier layer 2. The feedthrough 3 comprises a metallic material, for example copper or gold.

The sensor element 1 shown in FIG. 1 furthermore comprises two contact elements 4. The contact elements 4 are arranged at the underside 2b of the carrier layer 2. The contact elements 4 are formed in a direct way or directly at the feedthroughs 3. The contact elements 4 are in electrical and mechanical contact with the feedthroughs 3. The contact elements 4 serve for electrically contacting the sensor element 1. Furthermore, the sensor element 1 can be stacked onto other components of an electrical system, for example, by way of the contact elements 4.

The contact elements 4 can be embodied for example as bumps or as a thin electrode. The contact elements 4 comprise a metal, for example copper, gold, or solderable alloys. The feedthroughs 3 serve to connect the functional layer 5 at the top side 2a of the carrier layer 2 to the contact elements 4 at the underside 2b of the carrier layer 2 and thus to electrically contact the functional layer 5. A robust and reliable sensor element 1 is thus provided.

In a further exemplary embodiment (not explicitly illustrated), a protective layer 7 is furthermore arranged at a top side is of the sensor element 1. In this case, the protective layer 7 is formed directly on the functional layer 5. The protective layer 7 completely covers a top side 5a of the functional layer 5. The protective layer 7 preferably comprises $SiO_2$. The protective layer 7 serves to protect the functional layer 5 and the sensor element 1 against external influences (in this respect, also see FIG. 2).

The sensor element 1, by virtue of its specific contacting (feedthroughs 3, contact elements 4) and the specific layer construction (thin-film NTC layer), is designed such that it can be integrated as a complete component in an Si chip or on a printed circuit board. In particular, the sensor element 1 is configured to be integrated as a discrete component in MEMS or SESUB structures.

Overall, the sensor element 1 is embodied very compactly. The sensor element 1 has a very small dimensioning. The sensor element 1 has a width of preferably less than or equal to 500 μm, for example 50 μm, 100 μm, 250 μm, 300 μm, 400 μm or 450 μm. The sensor element 1 has a length of preferably less than or equal to 500 μm, for example, 50 μm, 100 μm, 250 μm, 300 μm, 400 μm or 450 μm. Preferably, the sensor element 1 has a rectangular basic shape. The sensor element 1 has a height (extent in the stacking direction) of preferably less than or equal to 100 μm, for example 10 μm, 50 μm or 80 μm.

By virtue of the compact design and the contacting by means of the feedthroughs 3 and the contact elements 4, the sensor element is outstandingly suitable for integration in MEMS or SESUB structures.

Figure 2:
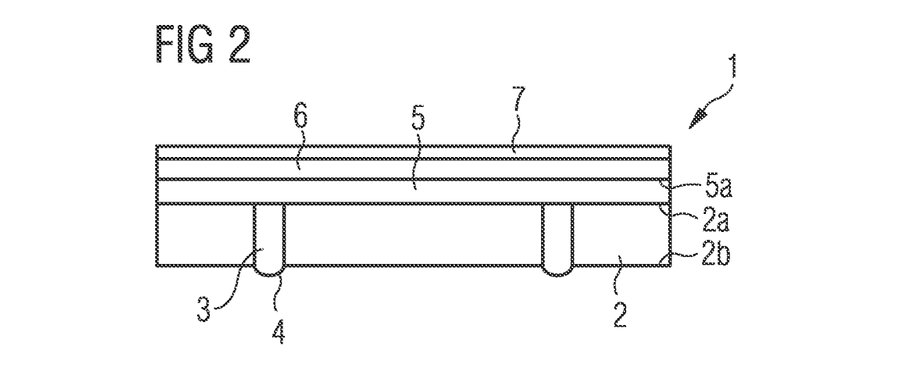
FIG. 2 shows a sensor element in a second embodiment.

FIG. 2 shows a sensor element 1 in a second embodiment. In contrast to the sensor element 1 described in association in FIG. 1, the sensor element 1 in accordance with FIG. 2 additionally comprises a top electrode 6. The top electrode 6 is arranged on the top side 5a of the functional layer 5. In particular, the top electrode 6 is applied directly on the functional layer 5. In this exemplary embodiment, the top electrode 6 completely covers the top side 5a of the functional layer 5. The functional layer 5 can be contacted from the top side by means of the top electrode 6. The contacting on the underside is affected by way of the feedthroughs 3 and contact elements 4.

The top electrode 6 comprises a metallic material, preferably Au, Ni, Cr, Ag, W, Ti or Pt. Preferably, the top electrode 6 is deposited on the functional layer 5, for example by means of a PVD or CVD process or electrolytically. Preferably, the top electrode 6 is sputtered on the functional layer 5. The top electrode 6 is a thin-film electrode. In other words, the top electrode 6 preferably comprises a thin metal film. The top electrode 6 has a thickness d or height of ≥100 nm and ≤1 μm, for example 500 nm.

In this exemplary embodiment, the sensor element 1 furthermore comprises the protective layer 7 already described in association with FIG. 1. Therefore, in the case shown, the top electrode 6 is arranged between functional layer 5 and protective layer 7. To put it another way, in this exemplary embodiment, the protective layer 7 is formed directly on the top electrode 6.

In an alternative exemplary embodiment (not explicitly illustrated), however, the protective layer 7 can also be omitted. In this case, the top electrode 6 forms the top side of the sensor element 1. In this exemplary embodiment, there is the possibility of realizing additional contacting, for example by wire bonding on the top electrode 6 (not explicitly illustrated).

With regard to all further features of the sensor element 1 in accordance with FIG. 2, reference is made to the description concerning FIG. 1.

Figure 3:
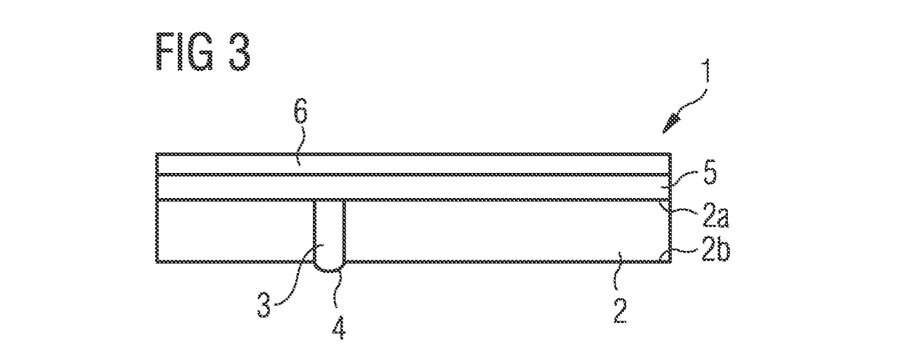
FIG. 3 shows a sensor element in a third embodiment.

FIG. 3 shows a sensor element 1 in a third embodiment. In this exemplary embodiment, the sensor element 1 comprises only one feedthrough 3 and one contact element 4, whereby the functional layer 5 is contacted from the underside. The contact element 4 can be embodied as a bump or as a thin electrode, as already described.

In this exemplary embodiment, the sensor element 1 furthermore comprises the top electrode 6 already described in association with FIG. 2. Unlike in FIG. 2, in this exemplary embodiment, the top electrode 6 is absolutely necessary for the (top-side) contacting of the functional layer 5.

With regard to all further features of the sensor element 1 in accordance with FIG. 3, reference is made to the description concerning FIG. 1 and concerning FIG. 2.

Figure 4:
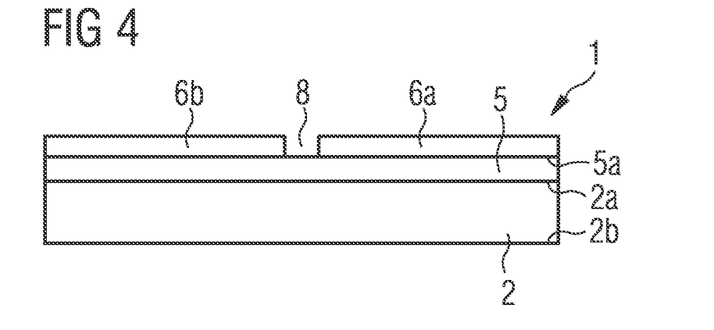
FIG. 4 shows a sensor element in a fourth embodiment.

FIG. 4 shows a sensor element 1 in a fourth embodiment. In this exemplary embodiment, the sensor element 1 comprises no feedthroughs 3 and also no contact elements 4 at the underside 2b of the carrier layer 2. Rather, the functional layer 5 here is contacted exclusively from the top side. In particular, the sensor element 1 comprises two top electrodes 6a, 6b for the electrical connection of the sensor element 1. The top electrodes 6a, 6b are formed, preferably deposited, directly on the functional layer 5, as has already been explained in association with FIG. 2. The top electrodes 6a, 6b are arranged next to one another on the functional layer 5.

The respective top electrode 6a, 6b can be formed as a single layer or in a multilayered fashion. The respective top electrode 6a, 6b is preferably a thin-film electrode. The respective top electrode 6a, 6b preferably comprises at least one sputtered metal layer. By way of example, the respective top electrode 6a, 6b comprises Au, Ni, Cr, Ag, W, Ti or Pt. Preferably, the respective top electrode 6a, 6b has a thickness or height of between 100 µm and 1 µm.

In this exemplary embodiment, the top electrodes 6a, 6b form the top side of the sensor element 1. As an alternative thereto (not explicitly illustrated), however, a protective layer 7 can also be provided, which is arranged on the top electrodes 6a, 6b.

The top electrodes 6a, 6b are electrically isolated from one another. For this purpose, at least one cutout or gap 8 is formed between the top electrodes 6a, 6b, as is illustrated in FIG. 4. Said cutout 8 spatially separates and electrically isolates the top electrodes 6a, 6b. The resistance of the sensor element 1 can be set by way of the size (horizontal extent, that is to say extent perpendicular the stacking direction) of the cutout 8. If the cutout 8 is reduced in size, then the resistance decreases. As a result, however, a variation of the resistance is also increased. In order to avoid this or in order to enlarge the area between the top electrodes 6a, 6b and thus to reduce the resistance, a comb structure can also be provided between the top electrodes 6 (not explicitly illustrated). In this case, the top electrodes 6 are arranged next to one another in an intermeshing manner.

Figure 5:
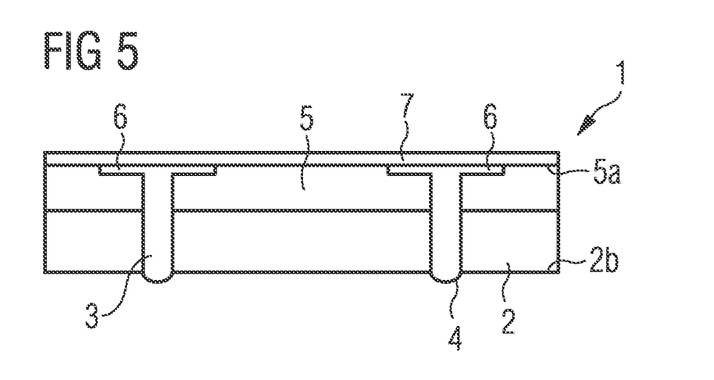
FIG. 5 shows a sensor element in a fifth embodiment.
Figure 6:
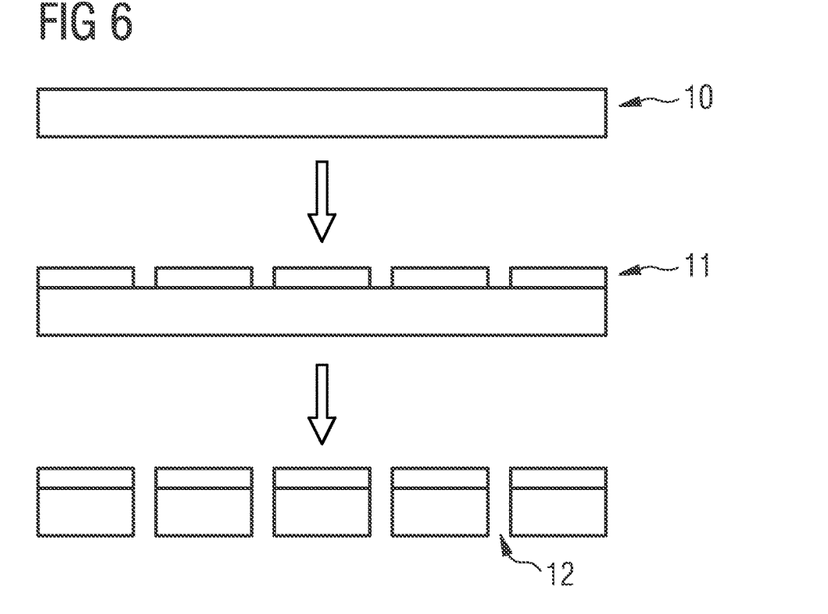
FIGS. 6-10 show a method for producing a sensor element.

FIG. 5 shows a sensor element 1 in a fifth embodiment. In this exemplary embodiment, the sensor element 1 comprises two feedthroughs 3, two contact elements 4, and two top electrodes 6.

In comparison with the exemplary embodiment shown in FIG. 1, in this exemplary embodiment the feedthroughs 3 completely penetrate through not only the carrier layer 2 but also the functional layer 5. In particular, the respective metallic feedthrough 3 projects into the functional layer 5 and is enclosed by the latter. The respective feedthrough thus extends from the underside 2b of the carrier layer 2 through the carrier layer 2 and the functional layer 5 as far as the top side 5a of the functional layer 5.

A respective top electrode 6 is formed at the top side of the respective feedthrough 3. In this exemplary embodiment, the respective top electrode 6 is also embedded at least partly into the functional layer 5. The top electrodes 6 thus at least partly form the top side 5a of the functional layer 5.

The protective layer 7 is formed directly on the functional layer 5. In this case, the protective layer 7 covers the top side 5a of the functional layer 5 which is at least partly formed by the top electrodes 6.

The contacting on the underside is affected by way of feedthroughs 3 and contact elements 4, for example bumps. In this case, it is also possible for more than the feedthroughs illustrated in FIG. 5 to be provided, for example four feedthroughs. Furthermore, in this exemplary embodiment, a protective layer 7 is situated at the top side is of the sensor element 1.

FIGS. 6 to 10 show a method for producing a sensor element 1. Preferably, the sensor element 1 in accordance with any of the exemplary embodiments described above is produced by the method. Therefore, all features that have been described in association with the sensor element 1 also find application for the method, and vice versa.

In a first step A), a carrier material 10 for forming the carrier layer 2 described above is provided (see top of FIG. 6). The carrier material 10 preferably comprises Si, SiC or glass.

In a next step B), the feedthroughs 3 described above are produced. For this purpose, vias/perforations 12 are produced in the carrier material 10 for example by photolithography and subsequent plasma etching ("dry etching") (see middle and bottom of FIG. 6). Alternatively, the vias 12 can also be produced by a laser (laser drilling).

Figure 7:
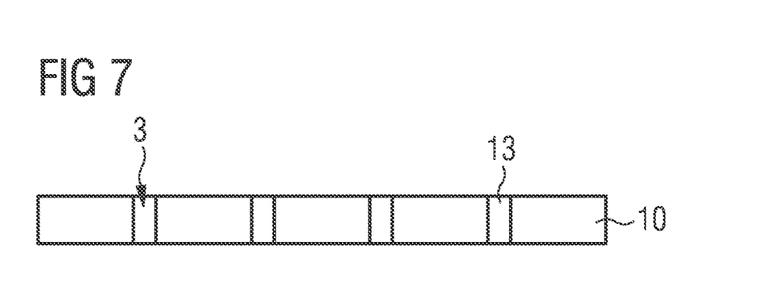

In a step C), the vias/perforations 12 are filled with a metallic material 13 (for example copper), for example electrolytically (in this respect, see FIG. 7). The photoresist 11 (see FIG. 6) used during the photolithography is subsequently washed away.

Figure 8:
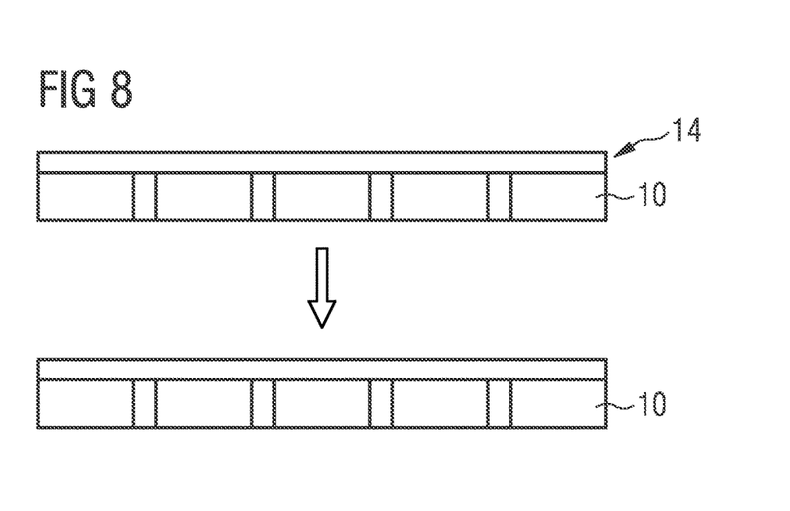

In a further step D), the carrier material 10 is coated with a sensor material 14 for forming the functional layer 5 (in this respect, see FIG. 8). The sensor material 14 comprises an NTC ceramic, for example. The coating is preferably affected by means of a PVD or CVD process. In this case, a thin sensor film is produced on the carrier material 10 (thin-film NTC). Optionally, a heat treatment step can be affected after step D).

In an alternative exemplary embodiment, method step D) can also be affected before producing the vias/perforations 12 (step B)). In this case, the metallic material 13 projects into the functional layer 5 and is enclosed by the latter (in this respect, also see the exemplary embodiment described in association with FIG. 5).

Figure 9:
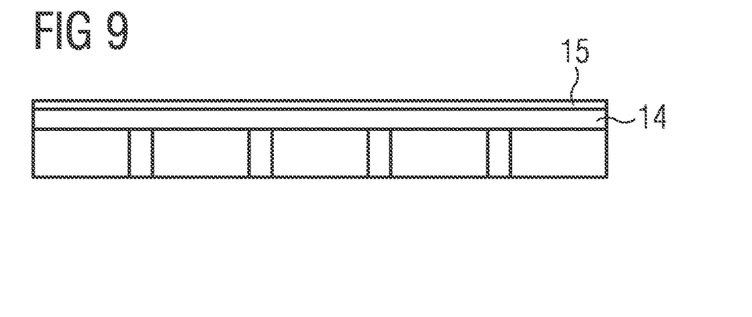

In a further step, depositing electrode material 15 for forming the at least one top electrode 6 is affected (in this respect, see FIG. 9 in association with FIGS. 2 to 5). The electrode material 15 preferably comprises Au, Ni, Cr, Ag, W, Ti or Pt. The depositing is affected by means of a PVD or CVD process of electrolytically. A single-layer or multilayered thin top electrode 6 (thin-film electrode) is produced in this case. In particular, the top electrode 6 is deposited as a thin electrode film on the sensor material 14 in this method step. If two top electrodes 6 are deposited, then provision is made of a cutout (see FIG. 4) or a comblike structure for electrically isolating the top electrodes 6a, 6b.

An optional step can furthermore involve forming the protective layer 7 by applying the corresponding material (preferably $SiO_2$) either to the sensor material 14 (exemplary embodiment in accordance with FIG. 1) or to the electrode material 15 (exemplary embodiments in accordance with FIGS. 2 to 5).

Figure 10:
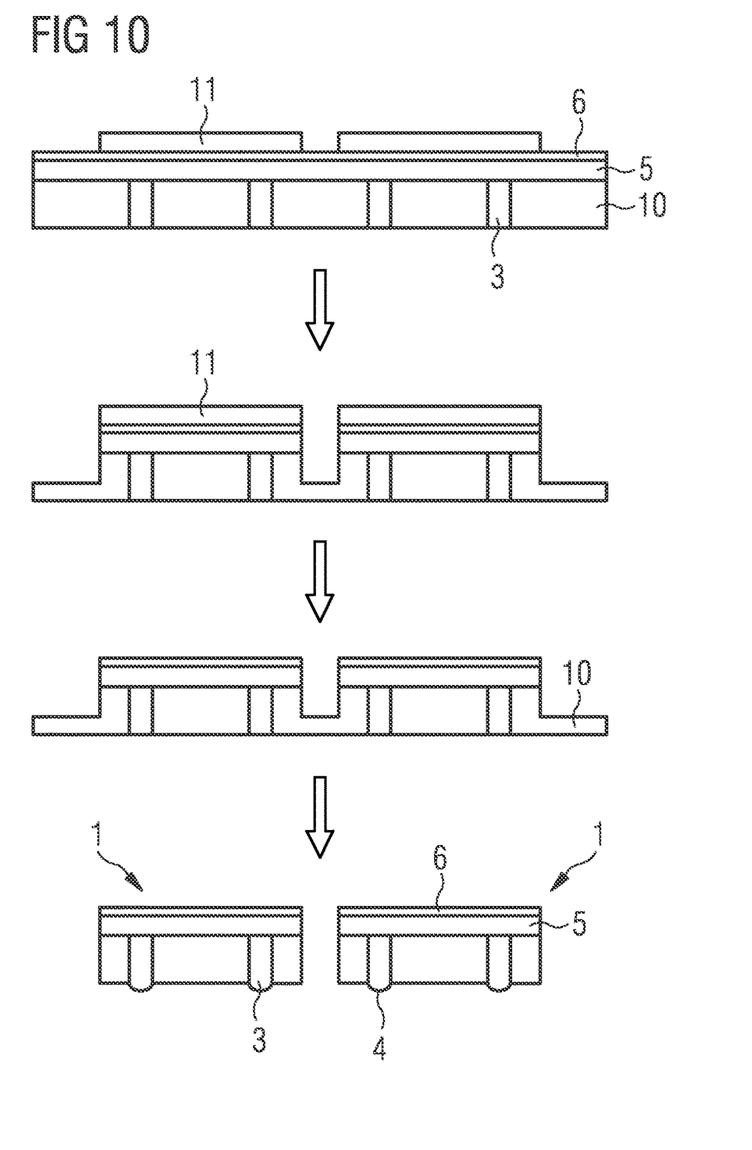

In a final step E), the sensor elements 1 are singulated (in this respect, see FIG. 10). This is affected by application of photoresist 11 and subsequent plasma etching or sawing of the functional layer 5 and that part of the carrier material 10 which determines the height or thickness of the later carrier layer 2 (notching).

As an alternative thereto, thinning the carrier material 10 on the underside can be affected in two steps, wherein in a first step the carrier material 10 is two-dimensionally etched away or ground away, and in a second step the singulation is affected by areal etching and the contact elements 4 are uncovered, without the metal being oxidized in the process.

The description of the subjects specified here is not restricted to the individual specific embodiments. Rather, the features of the individual embodiments can be combined with one another in any desired way—insofar as is technically practical.

The invention claimed is:

1. A sensor element comprising:
   at least one carrier layer having a top side and an underside;
   at least one functional layer arranged at the top side of the carrier layer and comprising a material having a temperature-dependent electrical resistance; and
   at least one protective layer,
   wherein the protective layer is arranged at a top side of the sensor element and at at least one side surface of the sensor element,
   wherein the protective layer completely covers the top side of the sensor element,
   wherein the sensor element is configured to be integrated as a discrete component directly into an electrical system, and
   wherein the sensor element is configured to measure a temperature.

2. The sensor element according to claim 1, wherein the carrier layer comprises silicon, silicon carbide or glass.

3. The sensor element according to claim 1, wherein the functional layer comprises a thin-film negative temperature coefficient (NTC) layer.

4. The sensor element according to claim 1, wherein the functional layer comprises a semiconducting material based on silicon carbide in a hexagonal, wurtzite-like structure or a cubic phase in a zinc blende structure type, or wherein the functional layer comprises a metal nitride in the wurtzite structure type.

5. The sensor element according to claim 1, wherein the protective layer comprises $SiO_2$.

6. The sensor element according to claim 1, further comprising at least one feedthrough, wherein the feedthrough completely penetrates through the carrier layer, and wherein at least one contact element for electrically contacting the sensor element is arranged at the underside of the carrier layer.

7. The sensor element according to claim 6, wherein the sensor element comprises at least two feedthroughs, wherein two contact elements are arranged at the underside of the carrier layer.

8. The sensor element according to claim 1, further comprising at least one top electrode, wherein the top electrode is configured for electrically contacting the functional layer from a top side of the functional layer.

9. The sensor element according to claim 8, wherein the top electrode is arranged directly on the functional layer.

10. The sensor element according to claim 8, wherein the top electrode comprises at least one sputtered layer.

11. The sensor element according to claim 8, further comprising at least two top electrodes, wherein the top electrodes are arranged next to one another, and wherein the top electrodes are spatially separated and electrically isolated from one another by at least one cutout.

12. The sensor element according to claim 1, wherein the sensor element is configured for direct integration into a MEMS structure and/or into a semiconductor embedded in substrate (SESUB) structure.

13. A method for producing the sensor element according to claim 1, the method comprising:
    providing a carrier material for forming the carrier layer;
    forming at least one feedthrough, wherein the feedthrough completely penetrates through the carrier material;
    filling the at least one feedthrough with a metallic material;
    coating the carrier material with a sensor material for forming the functional layer; and
    singulating for forming the sensor element.

14. The method according to claim 13, further comprising depositing at least one top electrode onto a top side of the sensor material before singulating the sensor element.

15. The method according to claim 13, wherein the sensor material comprises a negative temperature coefficient (NTC) material.

16. The method according to claim 13, further comprising heating after coating the carrier material with the sensor material.

17. The method according to claim 13, wherein coating the carrier material with the sensor material is performed before forming the at least one feedthrough.

18. A sensor element comprising:
    at least one carrier layer having a top side and an underside;
    at least one functional layer, wherein the functional layer is arranged at the top side of the carrier layer and comprises a material having a temperature-dependent electrical resistance; and
    at least one protective layer arranged at a top side of the sensor element and at least one side surface of the sensor element, wherein the protective layer completely covers the top side of the sensor element,
    wherein the sensor element is configured to be integrated as a discrete component directly into an electrical system,
    wherein the sensor element is configured for direct integration into a MEMS structure and/or into a semiconductor embedded in substrate (SESUB) structure, and
    wherein the sensor element is configured to measure a temperature.

* * * * *